(12) United States Patent
Takemoto et al.

(10) Patent No.: US 7,635,986 B2
(45) Date of Patent: Dec. 22, 2009

(54) POWER SOURCE NOISE MEASURING DEVICE, INTEGRATED CIRCUIT, AND SEMICONDUCTOR DEVICE

(75) Inventors: Takahito Takemoto, Kawasaki (JP); Akihiko Harada, Kawasaki (JP); Kazuhiro Furuya, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 354 days.

(21) Appl. No.: 11/737,215

(22) Filed: Apr. 19, 2007

(65) Prior Publication Data

US 2008/0106324 A1 May 8, 2008

(30) Foreign Application Priority Data

Sep. 25, 2006 (JP) .............................. 2006-259211

(51) Int. Cl.
*G01R 31/02* (2006.01)
*G01R 29/26* (2006.01)

(52) U.S. Cl. ....................... 324/765; 324/763
(58) Field of Classification Search ....................... None
See application file for complete search history.

(56) References Cited

U.S. PATENT DOCUMENTS

| | | | |
|---|---|---|---|
| 6,823,293 B2* | 11/2004 | Chen et al. ................. 702/191 |
| 6,842,027 B2* | 1/2005 | Liu et al. ................... 324/763 |
| 7,116,114 B2* | 10/2006 | Kajita ........................ 324/613 |
| 7,365,548 B2* | 4/2008 | Neuman ..................... 324/613 |
| 7,443,187 B2* | 10/2008 | Jenkins et al. ............. 324/763 |
| 2004/0128115 A1 | 7/2004 | Chen et al. |
| 2005/0114054 A1* | 5/2005 | Shimazaki et al. ............ 702/69 |
| 2005/0165573 A1 | 7/2005 | Takamiya et al. |

FOREIGN PATENT DOCUMENTS

JP 2001-53231 2/2001

OTHER PUBLICATIONS

European Patent Office Search Report issued Dec. 19, 2007 for corresponding European Patent Application No. 07106889.4.

* cited by examiner

*Primary Examiner*—Vinh P Nguyen
(74) *Attorney, Agent, or Firm*—Staas & Halsey LLP (57) ABSTRACT

To accurately measure power source noise generated inside an integrated circuit, the power source noise measuring device comprises: a mutual inductor pair placed inside an integrated circuit, the mutual inductor pair including (i) a first inductor connected to between power source voltages of the integrated circuit and (ii) a second inductor arranged opposite the first inductor, the both ends of which second inductor are connected to external output terminals; and a power source noise measuring unit which measures power source noise of the integrated circuit on the basis of a voltage waveform output from the second inductor of said mutual inductor pair via the external output terminals.

12 Claims, 5 Drawing Sheets

POWER SOURCE NOISE MEASURING DEVICE, INTEGRATED CIRCUIT, AND SEMICONDUCTOR DEVICE

BACKGROUND OF THE INVENTION

1) Field of the Invention

The present invention relates to a technique for measuring power source noise generated inside an integrated circuit [for example, LSI (Large Scale Integration)].

2) Description of the Related Art

There is a previous technique for measuring power source noise generated inside an integrated circuit (for example, LSI). In the technique, a probe is used to directly monitor, from outside, power source noise of a silicon chip in a LSI package (see, for example, the following patent document 1).

That is, in the previous art, a probe needle is directly made into contact with power wiring inside an LSI to measure power source noise.

However, like the following-mentioned patent document 1, in which a probe needle is directly made into contact with an internal circuit to measure power source noise, an impedance is applied when the probe needle touches the circuit. As a result, the voltage waveform is ruffled so that it is impossible to accurately monitor (measure) the waveform.

In addition, it is necessary that a hole is made on the substrate in order to directly make the probe needle into contact with the LSI internal circuit.

[Patent Document] Japanese Patent Application Laid-open No. 2001-53231

SUMMARY OF THE INVENTION

With the foregoing problems in view, it is an object of the present invention to make it possible to accurately measure power source noise generated inside an integrated circuit.

In order to accomplish the above object, according to the present invention, there is provided a power source noise measuring device, comprising: a mutual inductor pair placed inside an integrated circuit, the mutual inductor pair including (i) a first inductor connected to between power source voltages of the integrated circuit and (ii) a second inductor arranged opposite the first inductor, the both ends of which second inductor are connected to external output terminals; and a power source noise measuring unit which measures power source noise of the integrated circuit on the basis of a voltage waveform output from the second inductor of the mutual inductor pair via the external output terminals.

As a preferred feature, the power source noise measuring device further comprises a switching unit which switches between connection and disconnection of the first inductor of the mutual inductor pair to the power source voltages.

As a generic feature, there is provided a power source noise measuring device comprising: a first mutual inductor pair placed inside an integrated circuit, the first mutual inductor pair including (i) a first inductor connected between power source voltages of the integrated circuit and (ii) a second inductor arranged opposite the first inductor, the both ends of which second inductor are connected to between external output terminals of the integrated circuit; a variable power source provided outside the integrated circuit; a second mutual inductor pair placed inside the integrated circuit, the second mutual inductor pair including a third inductor connected to the variable power source and a fourth inductor arranged opposite the third inductor, the both ends of which fourth inductor are connected to external output terminals of the integrated circuit; an adjusting unit which adjusts voltage of the variable voltage source in such a manner that a first voltage waveform output from the second inductor of the first mutual inductor pair via external output terminals is the same or approximately the same as a second voltage waveform output from the fourth inductor of the second mutual inductor pair via external output terminals; and a power source noise measuring unit which measures power source noise of the integrated circuit on the basis of voltage of the variable power source adjusted by the adjusting unit.

As a preferred feature, the power source noise measuring unit measures amplitude and frequency of the power source noise on the basis of the second voltage waveform which is obtained after voltage of the variable power source is adjusted by the adjusting unit.

As another preferred feature, the power source noise measuring device further comprises: a first switching unit which switches between connection and disconnection of the first inductor of the first mutual inductor pair to between the power source voltages; and a second switching unit having the same construction as that of the first switching unit, the second switching unit switching between connection and disconnection of the third inductor of the second mutual inductor pair to the variable voltage source.

As another generic feature, there is provided an integrated circuit having an internal circuit which is connected between power source voltages to operate with supply of the power source voltages, comprising: a mutual inductor pair including (i) a first inductor connected between power source voltages and (ii) a second inductor placed opposite the first inductor; and a pair of external output terminals which are connected to the opposite ends, respectively, of the second inductor of the mutual inductor pair, the external output terminal pair outputting outside a voltage waveform induced by mutual induction.

As yet another generic feature, there is provided an integrated circuit having an internal circuit which is connected between power source voltages to operate with supply of the power source voltages, comprising: a first mutual inductor pair including (i) a first inductor connected between the power source voltages and (ii) a second inductor arranged opposite the first inductor; a first pair of external output terminals which are connected to the opposite ends, respectively, of the second inductor of the first mutual inductor pair, the first external output terminal pair outputting outside a voltage waveform induced by mutual inductance; a second mutual inductor pair including a third inductor connected to an external variable power source and the fourth inductor arranged opposite the third inductor; and a second pair of external output terminals which are connect to the opposite ends, respectively, of the fourth inductor of the second mutual inductor pair, the second pair of external output terminals outputting outside a voltage waveform induced by mutual inductance.

As a preferred feature, the integrated circuit further comprises: a first switching unit which switches between connection and disconnection of the first inductor of the first mutual inductor pair to between the power source voltages; and a second switching unit having the same construction as that of the first switching unit, the second switching unit switching between connection and disconnection of the third inductor of the second mutual inductor pair to the variable voltage source.

As another preferred feature, there is provided a semiconductor device, comprising: the above-described integrated circuit; and a couple of external output terminals which are connected to the first pair of external output terminals, respectively, of the integrated circuit.

As a further generic feature, there is provided a semiconductor device, comprising: the above-described integrated circuit; and a plurality of external output terminals connected to the first pair of external output terminals and the second pair of external output terminals of the integrated circuit.

In this manner, according to the present invention, using mutual inductance (mutual inductor pair or the first mutual inductor pair and the second mutual inductor pair), it is possible to measure power source noise generated inside an integrated circuit without contact. Thus, it is not necessary that a probe needle is directly made into contact with a circuit as in the previous art, so that it is possible to accurately measure power source noise without the noise waveform of the power source noise being ruffled.

In addition, since mutual inductance is provided inside the integrated circuit, it is possible to significantly easily measure power source noise.

Other objects and further features of the present invention will be apparent from the following detailed description when read in conjunction with the accompanying drawings.

DESCRIPTION OF THE PREFERRED EMBODIMENT(S)

Referring to the drawings, a description will be made hereinafter of one preferred embodiment of the present invention.

[1] Description of One Preferred Embodiment

Figure 1:
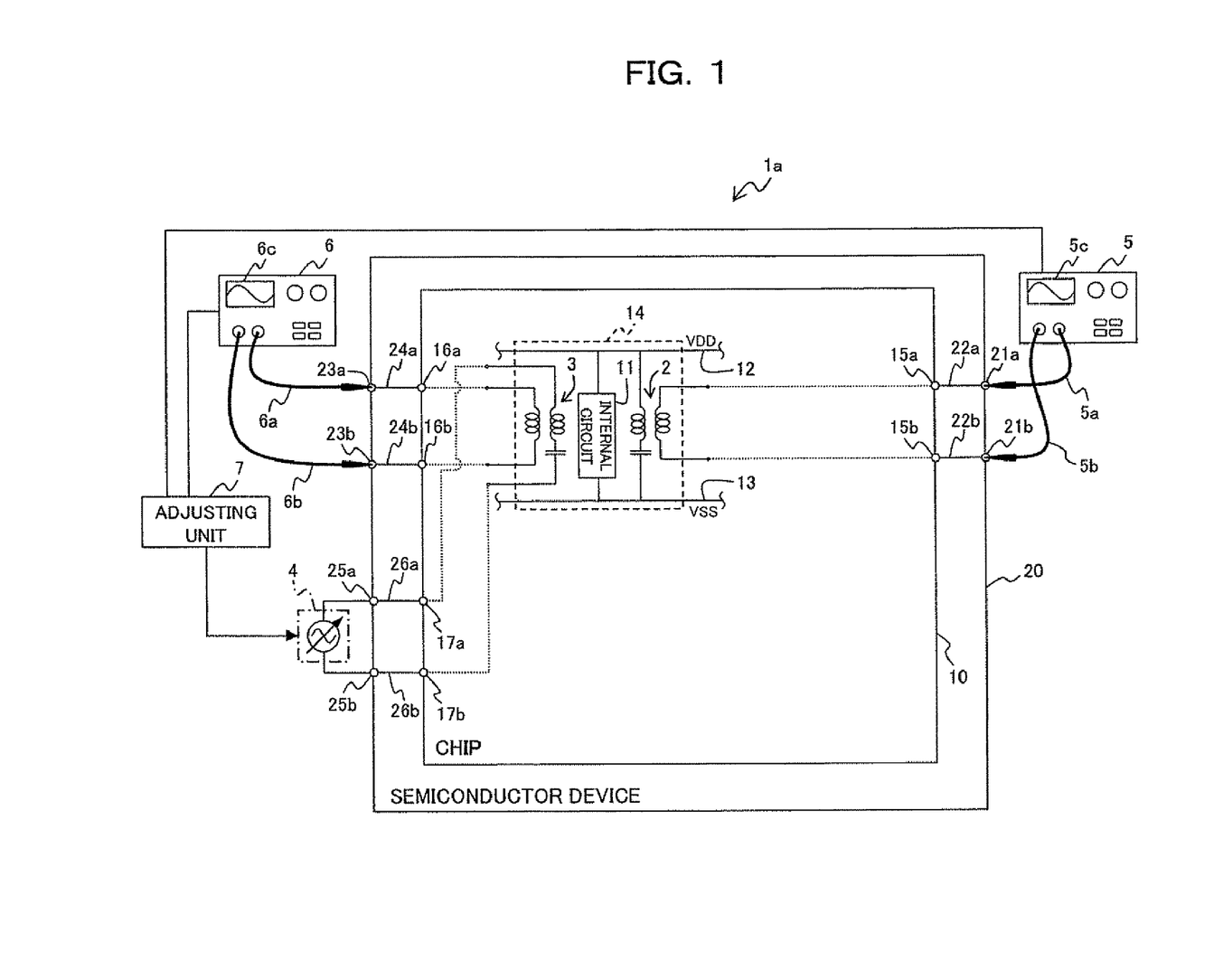
FIG. 1 is a diagram for describing the construction of a power source noise measuring device according to one preferred embodiment of the present invention.

First of all, referring to FIG. 1, a description will be made of a power source noise measuring device 1a according to one preferred embodiment of the present invention. As shown in FIG. 1, the power source noise measuring device 1a, which measures power source noise generated inside an chip {in the drawings, described as "chip"; an integrated circuit [for example, an LSI (Large Scale Integration)]}, has a first mutual inductor pair (mutual inductor pair) 2, a second mutual inductor pair 3, a variable power source 4, a first measuring unit 5, a second measuring unit (power source noise measuring unit) 6, and an adjusting unit 7.

In this instance, the chip 10, which is mounted on a semiconductor device 20 and is connected to between power source voltages (between VDD and VSS; between the power source and GND), has an internal circuit 11 which operates with supply of the power source voltages. The operation of the internal circuit 11 causes noise in VDD wiring 12 and VSS wiring 13.

The power source noise measuring device 1a measures power source noise in the vicinity of the internal circuit 11 (see area 14 indicated by the broken line in the drawing) due to operation of the internal circuit 11. That is, the first mutual inductor pair 2 and the second mutual inductor pair 3 are disposed at positions at which power source noise is desired to be measured. Here, they are disposed in the vicinity of the internal circuit 11.

More specifically, the first mutual inductor pair 2 and the second mutual inductor pair 3 face each other, sandwiching the internal circuit 11. They are arranged in such a manner that the distance between the internal circuit 11 and the first mutual inductor pair 2 is the same as the distance between the internal circuit 11 and the second mutual inductor pair 3. In this manner, two mutual inductor pairs 2 and 3 are arranged under the same condition, thereby making it possible to accurately measure power source noise.

Figure 2:
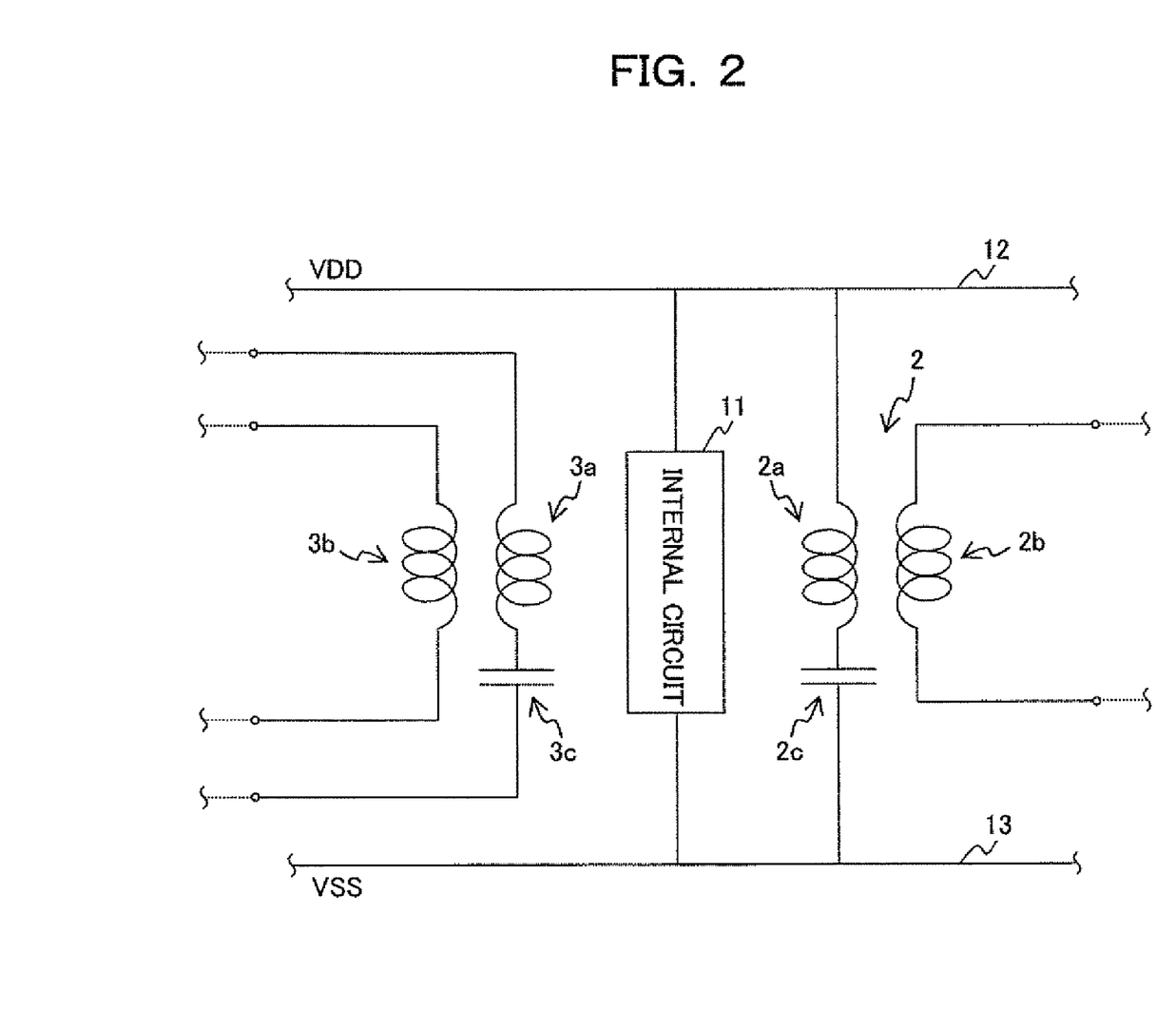
FIG. 2 is a diagram for describing a first mutual inductor pair and a second mutual inductor pair of the power source noise measuring device according to one preferred embodiment of the present invention.

FIG. 2 is an enlarged view of the vicinity of the internal circuit 11 of FIG. 1 (that is, a view for describing a first mutual inductor pair 2 and a second mutual inductor pair 3).

Referring to FIG. 1 and FIG. 2, a description will be made hereinafter of the first mutual inductor pair 2 and the second mutual inductor pair 3 of the power source noise measuring device 1a.

The first mutual inductor pair 2 is disposed inside the chip 10. The first mutual inductor pair 2 is composed of (i) a first inductor 2a that is connected to between power source voltages and (ii) a second inductor 2b, both of whose ends are coupled to a first pair of external output terminals (pair of external output terminals) 15a and 15b of the chip 10, respectively, and which is disposed opposite the first inductor 2a.

Further, the first mutual inductor pair 2 is equipped with a first capacitor (capacitor) 2c, which is connected in series with the first inductor 2a, to avoid a VDD-VSS short circuit between power source voltages.

In this first mutual inductor pair 2, when noise is caused in VDD-VSS wiring due to operation of the internal circuit 11, voltage is induced due to mutual inductance between the first inductor 2a and the second inductor 2b, and the induced voltage waveform (hereinafter will be called the "first voltage waveform") is output outside from the second inductor 2b via the first pair of external output terminals 15a and 15b.

In this instance, the external output terminal 15a of the chip 10 is connected to an external output terminal 21a of the semiconductor device 20 through a connection line 22a. The external output terminal 15b of the chip 10 is connected to the external output terminal 21b of the semiconductor device 20 through a connection line 22b. To the pair of external output terminals 21a and 21b of the semiconductor device 20 is connected a first measuring unit 5, which measures a first voltage waveform output from the second inductor 2b.

The second mutual inductor 3 is disposed inside the chip 10 like the first mutual inductor 2. The second mutual inductor pair 3 is composed of a third inductor 3a and a fourth inductor 3b. The third inductor 3a is connected to a variable voltage source 4 disposed outside the chip 10, in which voltage supply is variable (adjustable), via external terminals 17a and 17b and external terminals 25a and 25b of the semiconductor device 20. The fourth inductor 3b is disposed opposite the third inductor 3a and its both ends are connected to a second pair of output terminals 16a and 16b, respectively, of the chip 10. Here, the external terminal 17a of the chip 10 and the external terminal 25a of the semiconductor device 20 are connected through a connection line 26a, and the external terminal 17b of the chip 10 and the external terminal 25b of the semiconductor device 20 are connected through a connection line 26b.

Further, like the first mutual inductor pair 2, the second mutual inductor pair 3 is equipped with a second capacitor 3c, which is connected in series to the third inductor 3a.

In this second mutual inductor pair 3, voltage is induced due to mutual inductance between the third inductor 3a and the fourth inductor 3b with supply of AC voltage containing a DC component from the variable voltage source 4 to the third inductor 3a. The induced voltage waveform (hereinafter will be called the "second voltage waveform") is output outside from the fourth inductor 3b via the second pair of external output terminals 16a and 16b.

In this instance, the second external output terminal 16a of the chip 10 is connected to the external output terminal 23a of the semiconductor device 20 through the connection line 24a. The external output terminal 16b of the chip 10 is connected to the external output terminal 23b of the semiconductor device 20 through the connection line 24b. To the pair of external output terminals 23a and 23b of the semiconductor device 20 is connected a second measurement unit 6, which measures the second voltage waveform output from the fourth inductor 3b.

Figure 3:
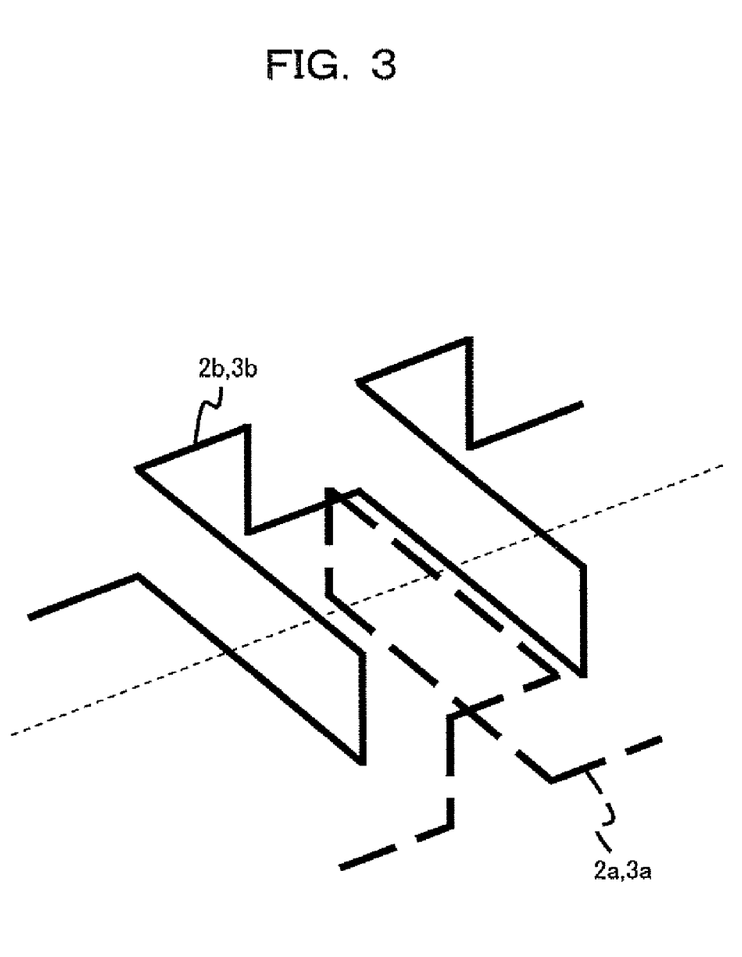
FIG. 3 is a view illustrating circuit patterns of a first through a fourth inductor of the first mutual inductor pair and the second mutual inductor pair of the power source noise measuring device according to one preferred embodiment of the present invention.

Here, as shown in FIG. 3, the circuit patterns of the first inductor 2a and the second inductor 2b of the first mutual inductor pair 2 are the same as those of the third inductor 3a and the fourth inductor 3b of the second mutual inductor pair 3, respectively. That is, the circuit pattern of the first mutual inductor pair 2 is the same as that of the second mutual inductor pair 3. Further, the circuit pattern of the first capacitor 2c of the first mutual inductor pair 2 is the same as that of the second capacitor 3c of the second mutual inductor pair 3.

That is, in the power source noise measuring device 1a, the size (H) of the first inductor 2a is the same as that of the third inductor 3a; the size (H) of the second inductor 2b is the same as that of the fourth inductor 3b. The capacity (F) of the first capacitor 2c is the same as that of the second capacitor 3c. In this manner, the first mutual inductor pair 2 and the second mutual inductor pair 3 have the same construction so that the first mutual inductor pair 2 and the second mutual inductor pair 3 induce the same voltage waveform due to mutual inductance under the same condition.

In addition, as shown in FIG. 1, the first measuring unit 5 measures the first voltage waveform which is induced by the first mutual inductor pair 2 and output from the second inductor 2b via the first pair of external output terminals 15a and 15b, and the connection lines 22a and 22b and the external output terminals 21a and 21b of the semiconductor device 20.

Here, the first measuring unit 5 is connected to the external output terminal 21a via a coupling connector (connection line) 5a and is connected to the external output terminal 21b via a coupling connector 5b. Further, the first measuring unit 5 has a display unit 5c on which the measured first voltage waveform is shown.

The second measuring unit 6 measures the second voltage waveform which is induced by the second mutual inductor pair 3 and is output from the fourth inductor 3b via the second pair of external output terminals 16a and 16b, and the connection lines 24a and 24b and the external output terminal pair 23a and 23b of the semiconductor device 20.

In this instance, the second measuring unit 6 is connected to the external output terminal 23a through the coupling connector 6a and is connected to the external output terminal 23b through coupling connector 6b. In addition, the second measuring unit 6 has a display unit 6c on which the measured second voltage waveform is displayed.

The adjusting unit 7 adjusts voltage of the variable voltage source 4 in such a manner that the second voltage waveform, which is output from the fourth inductor 3b of the second mutual inductor pair 3 via the second pair of external output terminals 16a and 16b, and the external output terminal pair 23a and 23b, and is measured by the second measuring unit 6, is the same or approximately the same as the first voltage waveform, which is measured by the first measuring unit 5.

Further, after the adjustment of the variable voltage source 4 by the adjusting unit 7, the power source noise measuring device 1a measures the second voltage waveform, which is measured by the second measuring unit 6, as voltage noise.

In other words, the second measuring unit 6 functions as a power source noise measuring unit, which measures power source noise of the chip 10 on the basis of the voltage of the variable voltage source 4 adjusted by the adjusting unit 7.

More specifically, the second measuring unit 6, as a power source noise measuring unit, measures the amplitude and the frequency of the second voltage waveform as the amplitude and the frequency of power source noise, on the basis of the second voltage waveform which is obtained after the adjusting unit 7 adjusts voltage of the variable voltage source 4.

In this manner, in the power source noise measuring device 1a, the first mutual inductor pair 2, which is connected between power source voltages, is provided for the purpose of measuring the voltage waveform of noise which is caused due to operation of the internal circuit 11. On the other hand, the second mutual inductor pair 3 is provided for the purpose of accurately measuring the amplitude and the frequency of power source noise which is actually generated.

That is, waveform transfer caused by mutual inductance (between the first inductor 2a and the second inductor 2b of the first mutual inductor pair 2) is due to generated flux interlinkage. Thus, since the distance between the inductances is large, the first voltage waveform measured by the first measuring unit 5 does not take the noise waveform of power source noise itself. The value of the amplitude of the voltage waveform is sometimes slightly different from that of the noise which is actually generated. In addition, the frequency of the voltage waveform is ruffled so that the first voltage waveform becomes deformed in comparison with the waveform of the power noise which is practically generated. Hence, the power source noise measuring device 1a has another mutual inductor pair 3, the second mutual inductor pair 3, for the purpose of obtaining the second voltage waveform as a reference waveform. Then, the adjusting unit 7 adjusts the voltage of the variable voltage source 4 in such a manner that the first voltage waveform becomes identical to the second voltage waveform. Since the value of the variable voltage source 4 having been adjusted is the noise which is actually generated in power wiring (VDD wiring 12 and VSS wiring 13), the second measurement unit measures the second voltage waveform after having been adjusted by the adjusting unit 7, thereby accurately obtaining the actual amplitude and the actual frequency of power source noise which is generated in the internal circuit 11.

Here, as described above, the chip 10 of the present invention has the first mutual inductor pair 2, the first pair of external output terminals 15a and 15b, the second mutual inductor pair 3, and the second pair of external output terminals 16a and 16b, in order to measure power source noise.

Further, as described above, the semiconductor device 20 of the present invention is mounted with the chip 10. To measure power source noise in the chip 10, the semiconductor device 20 has multiple external output terminals 21a, 21b, 23a, and 23b, which are connected to the first pair of external output terminals 15a and 15b and the second pair of external output terminals 16a and 16b of the chip 10, respectively.

In this manner, according to the power source noise measuring device 1a of one preferred embodiment of the present invention, the adjusting unit 7 adjusts voltage of the variable voltage source 4 in such a manner that the second voltage waveform from the second mutual inductor pair 3, which is measured by the second measuring unit 6, becomes identical to the first voltage waveform from the first mutual inductor pair 2 measured by the first measuring unit 5. The second measuring unit 6, as a power source noise measuring unit, measures power source noise of the chip 10 on the basis of voltage of the variable voltage source 4 having been adjusted by the adjusting unit 7. Thus, using mutual inductance (the first mutual inductor pair 2 and the second mutual inductor pair 3), it is possible to measure power source noise without contact. Since it is not necessary that a probe needle is directly made into contact with a circuit, as described in the previous art, noise waveform actually generated is not interfered for measurement. As a result, it is possible to accurately measure power source noise generated inside the chip 10.

Here, since the amplitude and the frequency of the second voltage waveform obtained after the adjusting unit 7 adjusts the voltage of the variable voltage source 4 is measured by the second measurement unit 6 as the amplitude and the frequency of power source noise, it is possible to measure power source noise more accurately with higher precision.

In addition, since the first mutual inductor pair 2 and the second mutual inductor pair 3 are provided inside the chip 10 as measurement circuits, measurement of power source noise is extremely easily possible, without making a hole on the semiconductor device 20 or the chip 10, so that the chip 10 (semiconductor device 20) which was subjected to power source noise measurement can be sold as a product.

Further, the power source noise measuring device 1a has the first capacitor 2c connected in series to the first inductor 2a of the first mutual inductor pair 2 and the second capacitor 3c having the same construction as that of the first capacitor 2c, which is connected in series to the third inductor 3a of the second mutual inductor pair 3. As a result, it is possible to suppress occurrence of short circuit between voltage power sources due to the first inductor 2a. In addition, since the second mutual inductor pair 3 has the second capacitor 3c, which has the same construction as that of the first capacitor 2c, at the same (relative) position, the first mutual inductor pair 2 and the second mutual inductor pair 3 resultantly induce the same voltage waveform due to mutual inductance under the same condition, so that it is possible to measure power source noise more accurately.

Furthermore, the circuit patterns of the first inductor 2a, the second inductor 2b, and the first capacitor 2c of the first mutual inductor pair 2 are the same as those of the third inductor 3a, the fourth inductor 3b, and the second capacitor 3c of the second mutual inductor pair 3, respectively. Thus, since the first mutual inductor pair 2 and the second mutual inductor pair 3 induce the same voltage waveform due to mutual inductance under the same condition. As a result, it is possible to measure power source noise more accurately.

Moreover, as described above, partly since the first mutual inductor pair 2 and the second mutual inductor pair 3 are arranged at the same distance from the internal circuit 11, and partly since the first mutual inductor pair 2 and the second mutual inductor pair 3 are provided under the same arrangement condition, it is possible to measure power source noise more accurately.

[2] Modified Examples of the Present Invention

The present invention should by no means be limited to the above-illustrated embodiment, and various changes or modifications may be suggested without departing from the gist of the invention.

[2-1] First Modified Example

Figure 4:
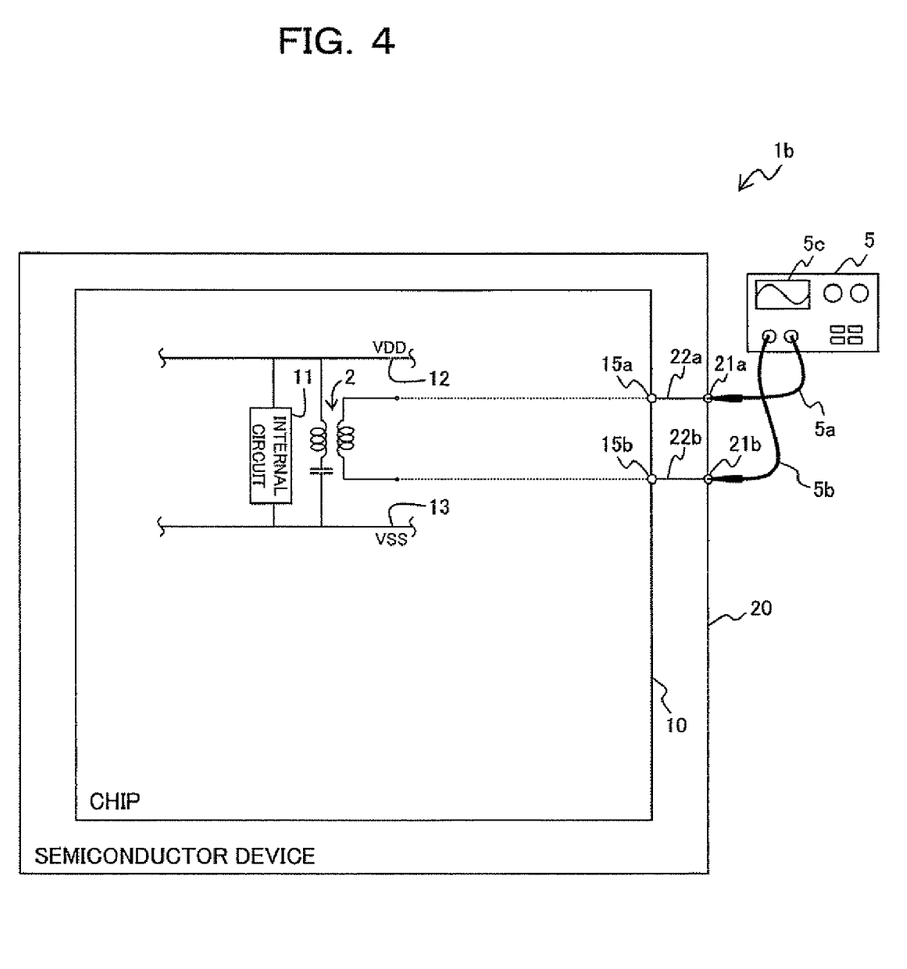
FIG. 4 is a diagram for describing a construction of a power source noise measuring device according to a first modified example of the present invention.

According to the above-described embodiment, the power source noise measuring device 1a has the first mutual inductor pair 2 and the second mutual inductor pair 3 inside the chip 10. The present invention should by no means be limited to this. As shown in FIG. 4, according to a first modified example of the present invention, the power source noise measuring device 1b has only the first mutual inductor pair 2 inside the chip 10, and the first measuring unit 5 measures the first voltage waveform as power source noise.

That is, the power source noise measuring device 1b according to the first modified example of the present invention has only the first mutual inductor pair 2 and the first measuring unit 5 without having the second mutual inductor pair 3, the variable voltage source 4, the second measurement unit 6, or the adjusting unit 7, as described above in the power source noise measuring device 1a.

In the power source noise measuring device 1b, the first mutual inductor pair 2 induces the first voltage waveform relating to power source noise when the internal circuit 11 is operating, and the first measuring unit 5, which functions as a power source noise measuring unit, measures the first voltage waveform as power source noise.

In this manner, according to the power source noise measuring device 1b of the first modified example of the present invention, effects similar to those realized by the power source noise measuring device 1a of the above-described preferred embodiment are realized.

That is, according to the power source noise measuring device 1b, using mutual inductance (the first mutual inductor pair 2), it is possible to measure power source noise without contact. Thus, the noise waveform actually generated is not ruffled in measurement, as described in the previous art, and it is possible to accurately measure power source noise generated inside the chip 10.

In addition, although it is not possible to measure power source noise with high precision like in the power source noise measuring device 1a, the device can be realized with a very simple construction, so that manufacturing cost is significantly reduced.

[2-2] Second Modified Example

Figure 5:
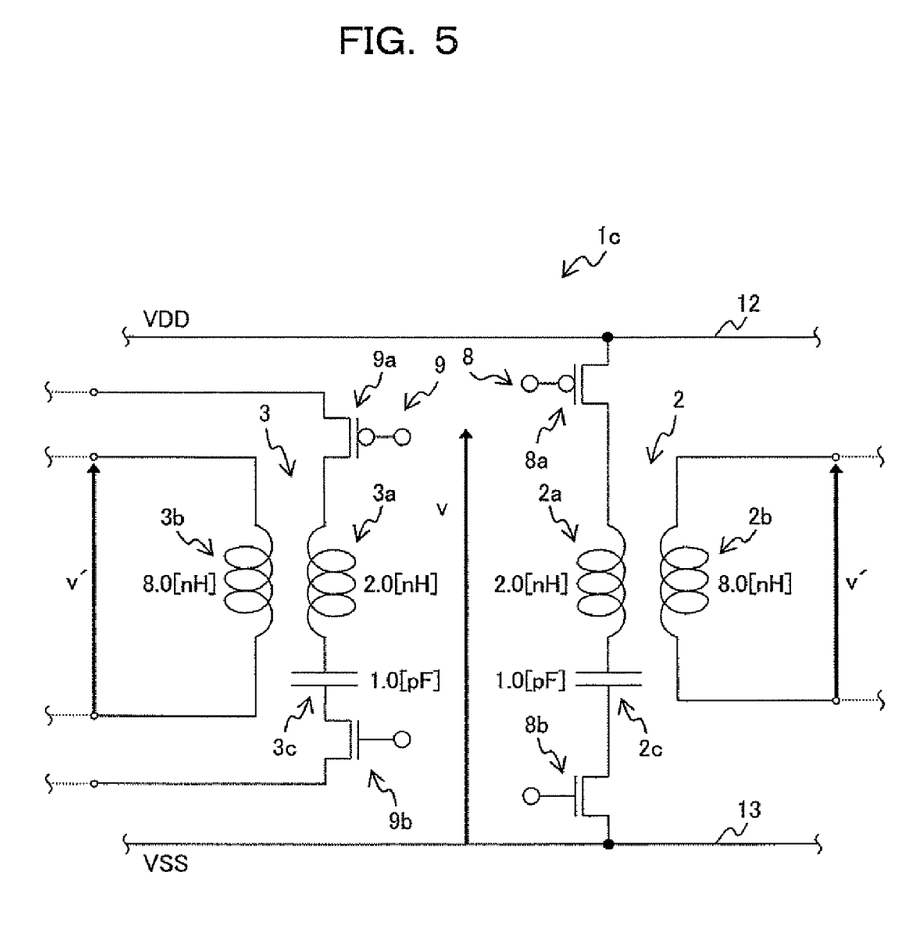
FIG. 5 is a diagram for describing a construction of an important part of the power source noise measuring device according a second modified example of the present invention.

According to the second modified example of the present invention as shown in FIG. 5, in the power source noise measuring device 1c, the power source noise measuring device 1a is added with a first switching unit (switching unit) 8 for switching between connection and disconnection of the first inductor 2a of the first mutual inductor pair 2 to between power source voltages and with a second switching unit 9, which has the same construction as that of the first switching unit 8, for switching between connection and disconnection of the third inductor 3a of the second mutual inductor pair 3 to the variable voltage source 4.

In this instance, FIG. 5 is an enlarged view of an area corresponding to the area 14 of FIG. 1, and the internal circuit 11 is not illustrated in FIG. 5. The arrow v in FIG. 5 indicates potential between power source voltages (between power source and GND); the arrows v' indicate induced voltages of the second inductor 2b and the fourth inductor 3b.

More precisely, the construction of the power source noise measuring device 1c is the same as that of the power source noise measuring device 1a except but the first switching unit 8 and the second switching unit 9. The first switching unit 8 has a switching transistor unit 8a which is provided for the first inductor 2a on the VDD wiring 12 side (that is, between the first inductor 2a and the VDD wiring 12) and a switching transistor unit 8a which is provided for the first inductor 2a on the VSS wiring 13 side (that is, between the first capacitor 2c and the VSS wiring 13).

The second switching unit 9 has a switching transistor unit 9a which is provided for the third inductor 3a on one side (that is, between the third inductor 3a and the variable voltage source 4) and a switching transistor unit 9b which is provided for the third inductor 3a on the other side (that is, between the second capacitor 3c and the variable voltage source 4).

In this instance, the construction of the switching transistor unit 8a is the same as that of the switching transistor unit 9a; the construction of the switching transistor unit 8b is the same as that of the second switching transistor unit 9b.

That is, the second switching unit 9 is provided for the purpose of making the impedance of the third inductor 3a the same as the impedance of the first inductor 2a having the first switching unit 8. Accordingly, the first mutual inductor pair 2 and the second mutual inductor pair 3 induce the same voltage waveform due to mutual inductance under the same condition. As a result, it becomes possible to more accurately measure power source noise.

On the basis of a control signal (selection signal) from outside, the switching transistor units 8a and 8b of the first switching unit 8 disconnects the first inductor 2a from between power source voltages (the VDD wiring 12 and the VSS wiring 13) except when the power noise is measured. When power noise is measured, the first inductor 2a is connected to between power source voltages (the VDD wiring 12 and the VSS wiring 13). Here, the control signal from outside is input to the first switching unit 8 via external terminals (not illustrated) and connection lines (not illustrated) which are provided for the chip 10 and the semiconductor device 20.

Likewise, on the basis of a control signal from outside, the switching transistor units 9a and 9b of the second switching unit 9 disconnects the third inductor 3a from the variable voltage source 4 except when power source noise is measured. When the power source noise is measured, the third inductor 3a is connected to the variable voltage source. Here, as described above, since the second switching unit 9 is provided for the purpose of making the impedance of the third inductor 3a the same as the impedance of the first inductor 2a having the first switching unit 8, the second switching unit 9 need not have a mechanism for receiving a control signal, and a connection state can always be maintained. With this arrangement, it is possible to simplify control and the circuit construction.

In addition, as illustrated in FIG. 5, considering resistance of transistors of the first switching unit 8 and the second switching unit 9 and wiring resistance which makes inductance, in the power source noise measuring device 1c, the first inductor 2a and third inductor 3a are set to 2.0 (nH), the second inductor 2b and the fourth inductor 3b are set to 8.0 (nH), and the first capacitor 2c and the second capacitor 3c are set to 1.0 (pF), thereby obtaining a sufficient amplitude.

In this manner, according to the power source noise measuring device 1c as the second modified example of the present invention, effects similar to those of the power source noise measuring device 1a, as described above, according to one preferred embodiment of the present invention are obtained. Further, since the first switching unit 8 makes the first inductor 2a of the first mutual inductor pair 2 disconnectable from between power source voltages, and since the second switching unit 9 makes the third inductor 3a of the second mutual inductor pair 3 disconnectable from the variable voltage source 4. Hence, the first inductor 2a and the third inductor 3a are being disconnected except when power source noise is measured, thereby eliminating the probability that the first inductor 2a and the third inductor 3a (in particular, the first inductor 2a connected between the voltage power sources) exhibit bad effects when the chip 10 is on a normal operation. Thus, by means of providing the first switching unit 8 and the second switching unit 9, it is possible to provide the mutual inductor pairs 2 and 3, as the power source noise measuring device 1c, for not only a chip 10 subjected to test (for power source noise measurement) but also a chip 10 as a product.

[2-3] Others

The power source noise measuring unit 1b may have a first switching unit 8 which the above-described power source noise measuring device 1c of the above-described second modified example has. This realizes effects similar to those of the power source noise measuring device 1c of the above-described second modified example.

Further, in the above-described embodiment, the adjusting unit 7 automatically adjusts voltage of the variable voltage source 4. The present invention should by no means be limited to this. For example, an operator who measures power source noise can manually adjusts voltage of the variable voltage source 4. In this case, the operator visually compares the first voltage waveform displayed on the display unit 5c of the first measuring unit 5 with the second voltage waveform displayed on the display unit 6c of the second measurement unit 6 and manually adjusts voltage of the variable voltage source 4 in such a manner that the above two waveforms are in good agreement. This realizes effects similar to those of the above-described embodiment.

What is claimed is:

1. A power source noise measuring device comprising:
a first mutual inductor pair placed inside an integrated circuit, said first mutual inductor pair including (i) a first inductor connected between power source voltages of the integrated circuit and (ii) a second inductor arranged opposite the first inductor, the both ends of which second inductor are connected to between external output terminals of the integrated circuit;
a variable power source provided outside the integrated circuit;
a second mutual inductor pair placed inside the integrated circuit, said second mutual inductor pair including a third inductor connected to said variable power source and a fourth inductor arranged opposite the third inductor, the both ends of which fourth inductor are connected to external output terminals of the integrated circuit;
an adjusting unit which adjusts voltage of said variable voltage source in such a manner that a first voltage waveform output from the second inductor of said first mutual inductor pair via external output terminals is the same or approximately the same as a second voltage waveform output from the fourth inductor of said second mutual inductor pair via external output terminals; and a power source noise measuring unit which measures power source noise of the integrated circuit on the basis of voltage of said variable power source adjusted by said adjusting unit.

2. A power source noise measuring device as set forth in claim 1, wherein said power source noise measuring unit measures amplitude and frequency of the power source noise on the basis of the second voltage waveform which is obtained after voltage of said variable power source is adjusted by said adjusting unit.

3. A power source noise measuring device as set forth in claim 1, further comprising:
a first switching unit which switches between connection and disconnection of the first inductor of said first mutual inductor pair to between the power source voltages; and
a second switching unit having the same construction as that of said first switching unit, said second switching unit switching between connection and disconnection of the third inductor of said second mutual inductor pair to said variable voltage source.

4. A power source noise measuring device as set forth in claim 1, wherein circuit patterns of the first inductor and the second inductor of said first mutual inductor pair are the same as those of the third inductor and the fourth inductor, respectively, of said second mutual inductor pair.

5. A power source noise measuring device as set forth in claim 1, further comprising:
a first capacitor arranged between the power source voltages, said first capacitor being connected in series to the first inductor of said first mutual inductor pair; and
a second capacitor having the same construction as that of said first capacitor, said second capacitor being connected in series to the third inductor of said second mutual inductor pair.

6. A power source noise measuring device as set forth in claim 5, wherein circuit patterns of the first inductor, the first capacitor, and the second inductor of said first mutual inductor pair are the same as those of the third inductor, the second capacitor, and the fourth inductor of said second mutual inductor pair.

7. An integrated circuit having an internal circuit which is connected between power source voltages to operate with supply of the power source voltages, comprising:
a first mutual inductor pair including (i) a first inductor connected between the power source voltages and (ii) a second inductor arranged opposite the first inductor;
a first pair of external output terminals which are connected to the opposite ends, respectively, of the second inductor of said first mutual inductor pair, said first external output terminal pair outputting outside a voltage waveform induced by mutual inductance;
a second mutual inductor pair including a third inductor connected to an external variable power source and the fourth inductor arranged opposite the third inductor; and
a second pair of external output terminals which are connect to the opposite ends, respectively, of the fourth inductor of said second mutual inductor pair, said second pair of external output terminals outputting outside a voltage waveform induced by mutual inductance.

8. An integrated circuit as set forth in claim 7, further comprising:
a first switching unit which switches between connection and disconnection of the first inductor of said first mutual inductor pair to between the power source voltages; and
a second switching unit having the same construction as that of said first switching unit, said second switching unit switching between connection and disconnection of the third inductor of said second mutual inductor pair to said variable voltage source.

9. An integrated circuit as set forth in claim 7, wherein circuit patterns of the first inductor and the second inductor of said first mutual inductor pair is the same as those of the third inductor and the fourth inductor of said second mutual inductor pair.

10. An integrated circuit as set forth in claim 7, further comprising a first capacitor arranged between the power source voltages, said first capacitor being connected in series to the first inductor of said first mutual inductor pair; and
a second capacitor having the same construction as that of said first capacitor, said second capacitor being connected in series to the third inductor of said second mutual inductor pair.

11. An integrated circuit as set forth in claim 10, wherein circuit patterns of the first inductor, the first capacitor, and the second inductor of said first mutual inductor pair are the same as those of the third inductor, the second capacitor, and the fourth inductor, respectively, of said second mutual inductor pair.

12. An semiconductor device, comprising:
an integrated circuit having an internal circuit which is connected between power source voltages to operate with supply of the power source voltages, including:
a first mutual inductor pair including (i) a first inductor connected between the power source voltages and (ii) a second inductor arranged opposite the first inductor;
a first pair of external output terminals which are connected to the opposite ends, respectively, of the second inductor of said first mutual inductor pair, said first external output terminal pair outputting outside a voltage waveform induced by mutual inductance;
a second mutual inductor pair including a third inductor connected to an external variable power source and the fourth inductor arranged opposite the third inductor; and
a second pair of external output terminals which are connect to the opposite ends, respectively, of the fourth inductor of said second mutual inductor pair, said second pair of external output terminals outputting outside a voltage waveform induced by mutual inductance; and
a plurality of external output terminals which are connected to said first pair of external output terminals and said second pair of external output terminals, respectively, of said integrated circuit.

* * * * *